(12) United States Patent
Yeh et al.

(10) Patent No.: US 10,607,661 B1
(45) Date of Patent: Mar. 31, 2020

(54) MEMORY DEVICE AND CONTROL METHOD THEREOF

(71) Applicant: MACRONIX INTERNATIONAL CO., LTD., Hsinchu (TW)

(72) Inventors: Teng-Hao Yeh, Zhubei (TW); Yi-Ching Liu, Hsinchu (TW)

(73) Assignee: MACRONIX INTERNATIONAL CO., LTD., Hsinchu (TW)

( * ) Notice: Subject to any disclaimer, the term of this patent is extended or adjusted under 35 U.S.C. 154(b) by 0 days.

(21) Appl. No.: 16/274,299

(22) Filed: Feb. 13, 2019

(51) Int. Cl.
| | | |
|---|---|---|
| G11C 7/00 | (2006.01) |
| G11C 5/14 | (2006.01) |
| G11C 5/02 | (2006.01) |
| G11C 5/06 | (2006.01) |
| G11C 16/04 | (2006.01) |
| G11C 11/408 | (2006.01) |
| G11C 7/18 | (2006.01) |
| G11C 8/08 | (2006.01) |
| G11C 11/4074 | (2006.01) |

(52) U.S. Cl.
CPC ............... *G11C 5/14* (2013.01); *G11C 5/025* (2013.01); *G11C 5/063* (2013.01); *G11C 7/18* (2013.01); *G11C 8/08* (2013.01); *G11C 11/4074* (2013.01); *G11C 11/4085* (2013.01); *G11C 16/0483* (2013.01)

(58) Field of Classification Search
CPC ....... G11C 5/147; G11C 5/14; G11C 11/4074; G11C 5/143; G11C 16/30
USPC .................................................... 365/226, 63
See application file for complete search history.

(56) References Cited

U.S. PATENT DOCUMENTS

2002/0018386 A1  2/2002  Ooishi
2015/0179271 A1  6/2015  Nam et al.

OTHER PUBLICATIONS

TIPO Office Action dated Sep. 26, 2019, Application No. 108104790, pp. 1-6.

*Primary Examiner* — Son T Dinh
(74) *Attorney, Agent, or Firm* — McClure, Qualey & Rodack, LLP

(57) ABSTRACT

A memory device and a control method thereof are provided. The memory device includes I memory blocks, I global power lines and I first local driver modules. Each memory block includes M gate control lines and a plurality of transistor units arranged in M rows. Gates of the transistor units in the m-th row are electrically connected to the m-th gate control line. The I global power lines are electrically connected to I pre-driver circuits and the I memory blocks, respectively. Each first local driver module is electrically connected to one global power line and one memory block. Each first local driver module includes M first local driver circuits. The m-th first local driver circuit is electrically connected to the m-th gate control line.

20 Claims, 13 Drawing Sheets

FIG. 3A (PRIOAR ART)

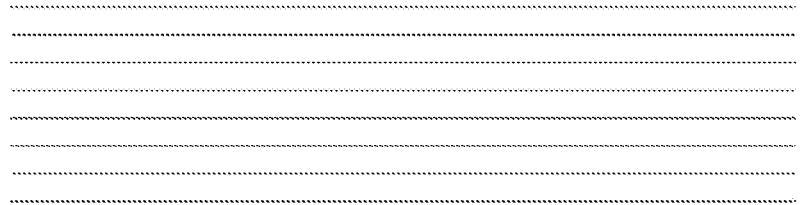
FIG. 12A
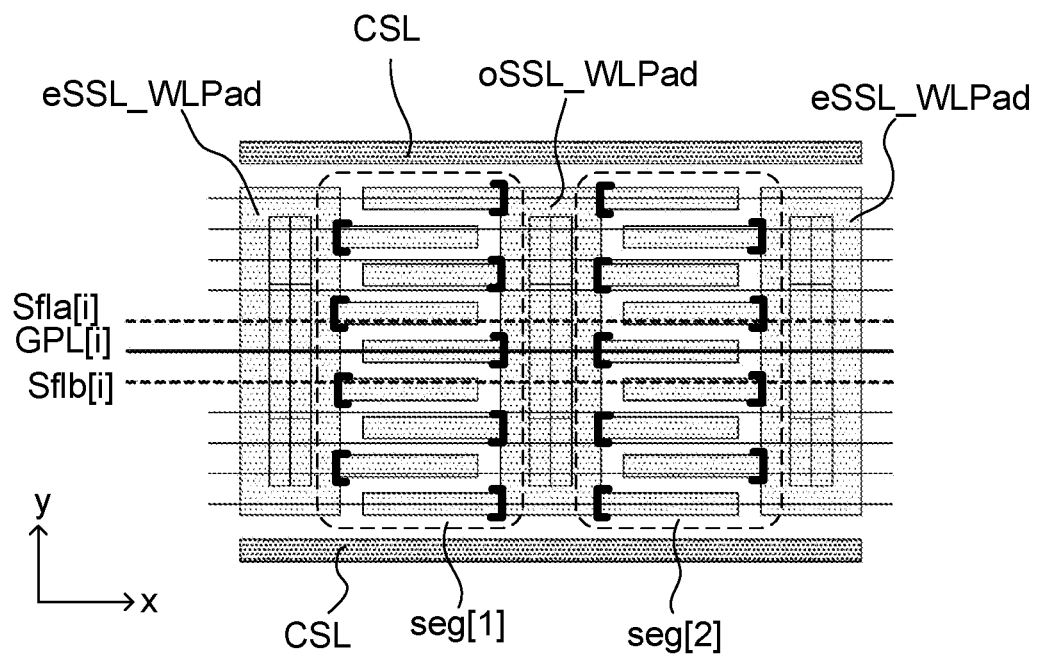
FIG. 12B
FIG. 13

MEMORY DEVICE AND CONTROL METHOD THEREOF

BACKGROUND OF THE INVENTION

Field of the Invention

The invention relates in general to a memory device and a related control method, and more particularly to a memory device and a related control method in which high voltage is provided to memory blocks through global power lines.

Description of the Related Art

Please refer to FIG. 1 which is a schematic diagram illustrating an architecture of a portion of a three-dimensional memory. The three-dimensional memory includes multiple layers of word line pads WLPad stacked along a z-direction as indicated in FIG. 1. There are finger-type structures formed at both ends of each word line pad WLPad[k−1], WLPad[k] and a ground selection layer GSL. Furthermore, parallel string selection lines SSL[j−1], SSL[j], SSL[j+1] are mounted on specific regions above word lines WL. Portions of the bit lines BL[n], BL[n+1] extend across the string selection lines SSL[j−1], SSL[j], SSL[j+1], and the other portions extend along the z-direction toward the word lines WL. String selection transistors SSM are formed at every juxtaposition between the bit lines BL[n], BL[n+1] and the string selection lines SSL[j−1], SSL[j], SSL[j+1]; memory cells MC are formed at every juxtaposition between the bit lines BL[n], BL[n+1] and the word lines WL; and ground selection transistors GSM are formed at every juxtaposition between the bit lines BL[n], BL[n+1] and the ground selection layer GSL. In the specification, the x-direction is defined as the extending direction of the string selection lines SSL, and the y-direction is defined as the extending direction of the bit lines BL.

Please refer to FIG. 2 which is a schematic diagram illustrating global word lines GWL and word line pads WLPad in the three dimensional memory. In the architecture, the word lines WL include the global word lines GWL (GWL[k−1], GWL[k], GWL[k+1]) and the word line pads WLPad (WLPad[k−1], WLPad[k], WLPad[k+1]) corresponding to the memory blocks. The word line pads WLPad[k−1], WLPad[k] and WLPad[k+1] are stacked in sequence and form stair structures. The global word lines GWL[k−1], GWL[k] and GWL[k+1] are electrically connected to the word line pads WLPad[k−1], WLPad[k] and WLPad[k+1], respectively.

Among these word lines WL, the resistance R and capacitance C of the global word lines GWL[k−1], GWL[k] and GWL[k+1] made of metal are much smaller than those of the word line pads WLPad[k−1], WLPad[k] and WLPad[k+1] made of polysilicon. Therefore, resistive-capacitive delay (RC delay) of the word lines WL mainly depends on the area of the word line pads WLPad[k−1], WLPad[k] and WLPad[k+1].

To increase the capacity of the memory device, the layers of the word line pads WLPad are increased. Due to the limitation of the process, the dimension of the stair structure for connecting the word line pads WLPad to the word lines WL cannot be further reduced. On the contrary, the area of the stair structure increases with the layers of the word line pads WLPad. However, a larger area of the word line pads WLPad results in longer RC delay of the word lines WL. In FIG. 2, the region corresponding to the finger-type structures of the word line pads WLPad[k−1], WLPad[k] and WLPad[k+1] are defined as a segment 10. While charging the word lines WL, the major RC delay occurs at segment 10 between every two adjacent word line pads WLPad[k−1], WLPad[k] and WLPad[k+1]. In other words, the RC delay of the word lines WL depends on the area of segment 10.

Please refer to FIGS. 3A and 3B which illustrate that increasing memory capacity by increasing the area of the word line pads WLPad will result in an increase in capacitance C and resistance R of the word line pads WLPad. In FIG. 3A, fewer layers of word line pads WLPad are provided, and both the word line pads WLPad and the stair structure STR1 require smaller area. In FIG. 3B, more layers of word line pads WLPad are provided, and both the word line pads WLPad and the stair structure STR2 require a larger area. Accordingly, increase in the areas of the word line pads WLPad[k−1], WLPad[k] and WLPad[k+1] represents increase in the capacitance C between every two adjacent word line pads WLPad[k−1], WLPad[k] and WLPad[k+1] (C2>C1) and increase in the resistance R of the word line pads WLPad[k−1], WLPad[k] and WLPad[k+1].

For a NAND flash memory, a memory block is programmed (erase operation or write operation) by provided with a high voltage (e.g., 20V~25V) through the word lines. If the resistance R and the capacitance C of the word line pads WLPad are increased, the RC delay effect becomes more serious. In other words, the memory controller can not pull up the word lines WL to a specific voltage rapidly.

SUMMARY OF THE INVENTION

The invention is directed to a memory device and a related control method in which global power lines corresponding to the memory blocks are provided. A high voltage is transmitted to a selected memory block through a corresponding global power line to rapidly pull up the voltage of the word lines WL in the selected memory block.

According to a first aspect of the present invention, a memory device is provided. The memory device includes I memory blocks, I global power lines and I first local driver modules. The i-th memory block selected from the I memory blocks includes M gate control lines and a plurality of transistor units. The transistor units of the i-th memory block are arranged in M rows wherein gates of the transistor units in the m-th row are electrically connected to the m-th gate control line selected from the M gate control lines. The I global power lines are electrically connected to the I memory blocks, respectively. The I first local driver modules are electrically connected to the I global power lines and the I memory blocks, respectively. The i-th first local driver module selected from the I first local driver modules is electrically connected to the i-th global power line selected from the I global power lines and the i-th memory block. The i-th first local driver module includes M first local driver circuits. The M first local driver circuits are electrically connected to the i-th global power line, and the m-th first local driver circuit selected from the M first local driver circuits is electrically connected to the m-th gate control line. The numbers m, M, i and I are integers wherein m is less than or equal to M, and i is less than or equal to I.

According to a second aspect of the present invention, a control method of a memory device, which includes I memory blocks and I global power lines corresponding to the I memory blocks, is provided. The control method includes steps of: selecting the i-th memory block selected from the I memory blocks to perform memory operation, wherein the i-th memory block includes M gate control lines and transistor units arranged in M rows; generating I block selection signals, wherein the i-th block selection signal selected from the I block selection signals corresponds to the i-th memory block; outputting a first power voltage to the i-th global power line corresponding to the i-th memory block according to the i-th block selection signal; transmitting the first power voltage to the M gate control lines of the i-th memory block; and the M rows of the transistor units of the i-th memory block receiving the first power voltage through the M gate control lines, respectively.

The above and other aspects of the invention will become better understood with regard to the following detailed description of the preferred but non-limiting embodiment(s). The following description is made with reference to the accompanying drawings.

BRIEF DESCRIPTION OF THE DRAWINGS

FIGS. 3A and 3B (Prior Art) are schematic diagrams illustrating that increasing memory capacity by increasing the area of the word line pads WLPad will result in an increase in capacitance C and resistance R of the word line pads WLPad.

FIG. 12A is a schematic diagram illustrating the gate control lines GCL of a memory block.

FIG. 12B is a schematic diagram illustrating the global power line GPL and the floating lines corresponding to a memory block.

FIG. 13 is a top view illustrating that the memory block in FIG. 11 is combined with the gate control lines GCL in FIG. 12A and the global power line GPL and the floating lines in FIG. 12B.

DETAILED DESCRIPTION OF THE INVENTION

Figure 1:
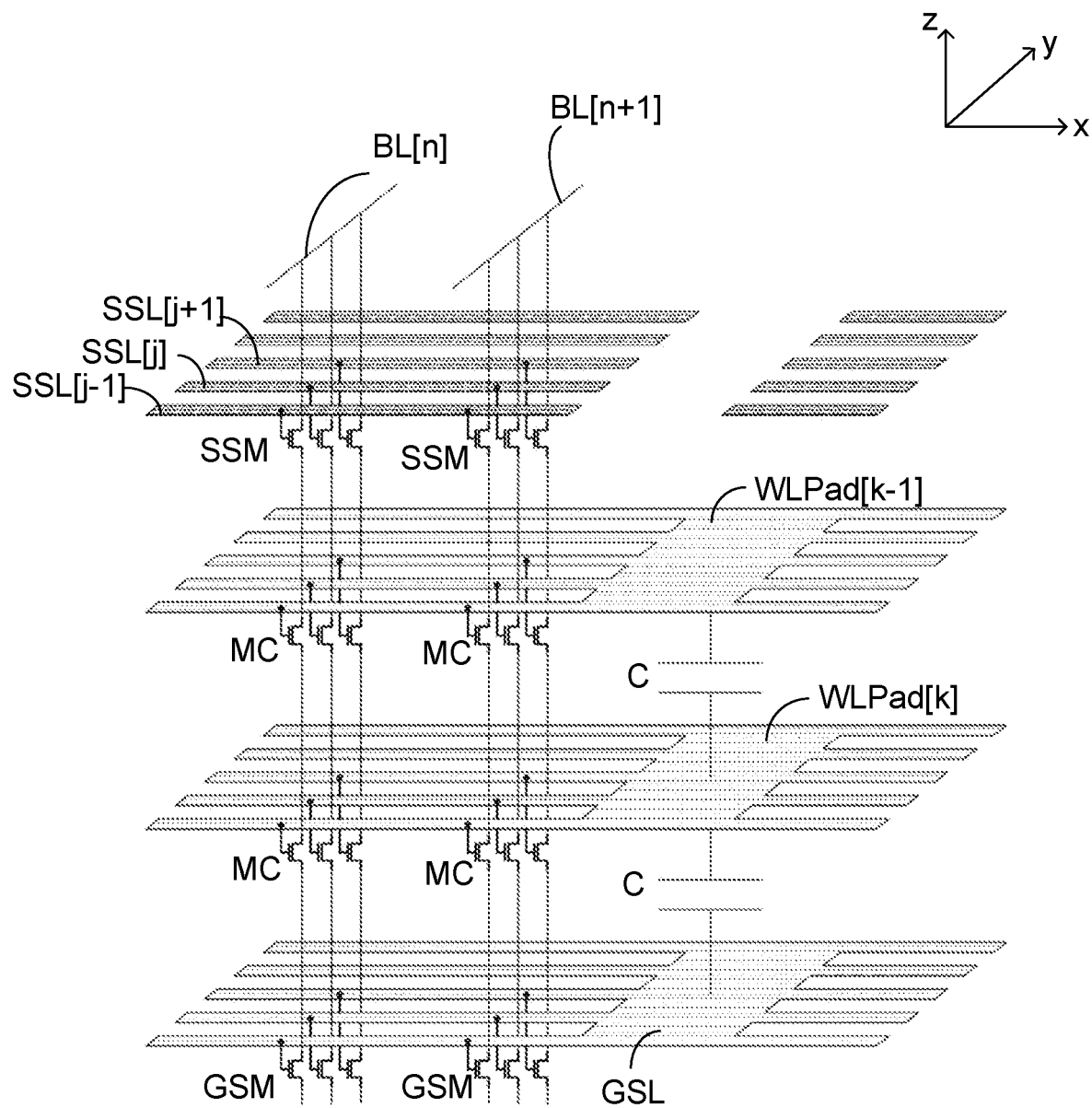
FIG. 1 (prior Art) is a schematic diagram illustrating an architecture of a portion of a three-dimensional memory.
Figure 2:
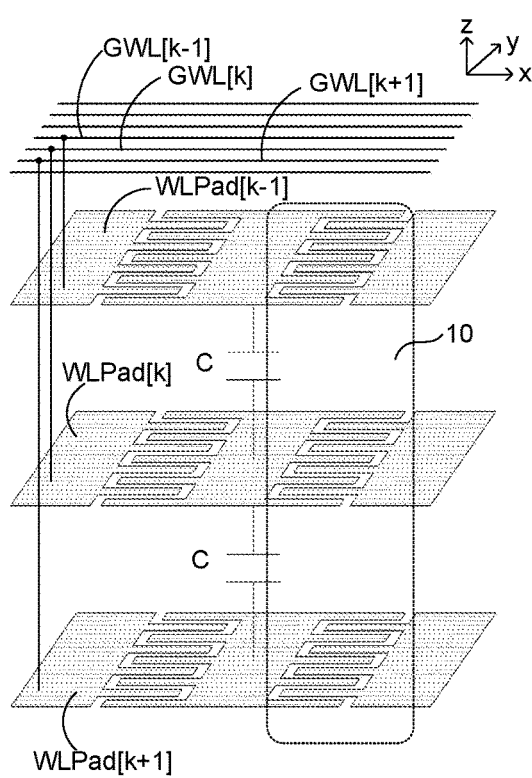
FIG. 2 (prior Art) is a schematic diagram illustrating global word lines and word line pads in the three-dimensional memory.
Figure 3B:
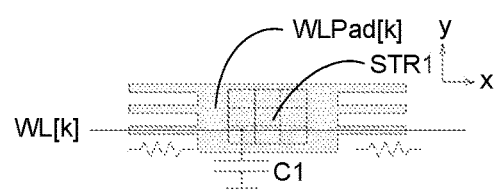
Figure 3B:
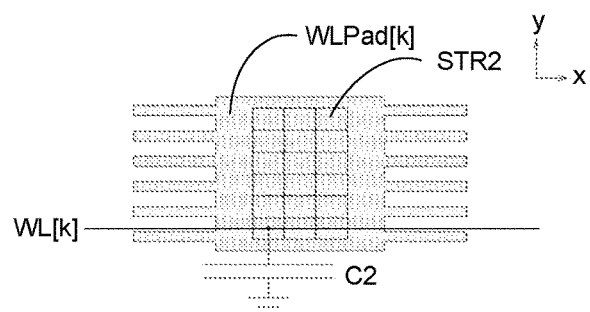
Figure 4:
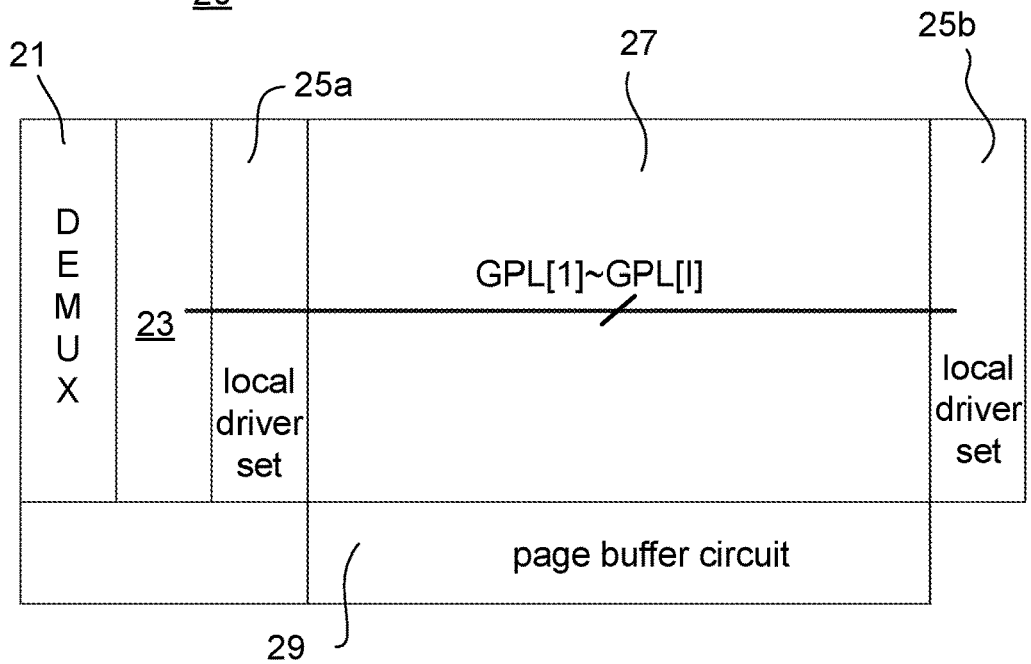
FIG. 4 is a schematic diagram illustrating a memory device according to an embodiment of the invention.

Please refer to FIG. 4 which is a schematic diagram illustrating a memory device according to an embodiment of the invention. The memory device 20 includes a demultiplexer circuit (DEMUX) 21, a pre-driver module 23, two local driver sets 25a and 25b, a page buffer circuit 29, I global power lines GPL[1]~GPL[I] and a memory array 27. For illustration purposes, the memory array 27 in the embodiment includes memory blocks Blk[1]~Blk[I], each of which includes one or more memory pages. The memory blocks Blk[1]~Blk[I] correspond to the global power lines GPL[1]~GPL[I], respectively. For example, the memory block Blk[i] corresponds to the global power line GPL[i].

The demultiplexer circuit 21 is electrically connected to the pre-driver module 23, and the pre-driver module 23 is electrically connected to the local driver set 25a and the local driver set 25b through the I global power lines GPL. The page buffer circuit 29 is electrically connected to the memory array 27. In view of clear expression, a specific signal line and a signal travelling over the specific signal line are represented by the same symbol. For example, the symbol Ssel represents a block selection line or a block selection signal, and other signal lines and related signals are represented by similar symbols.

Figure 5:
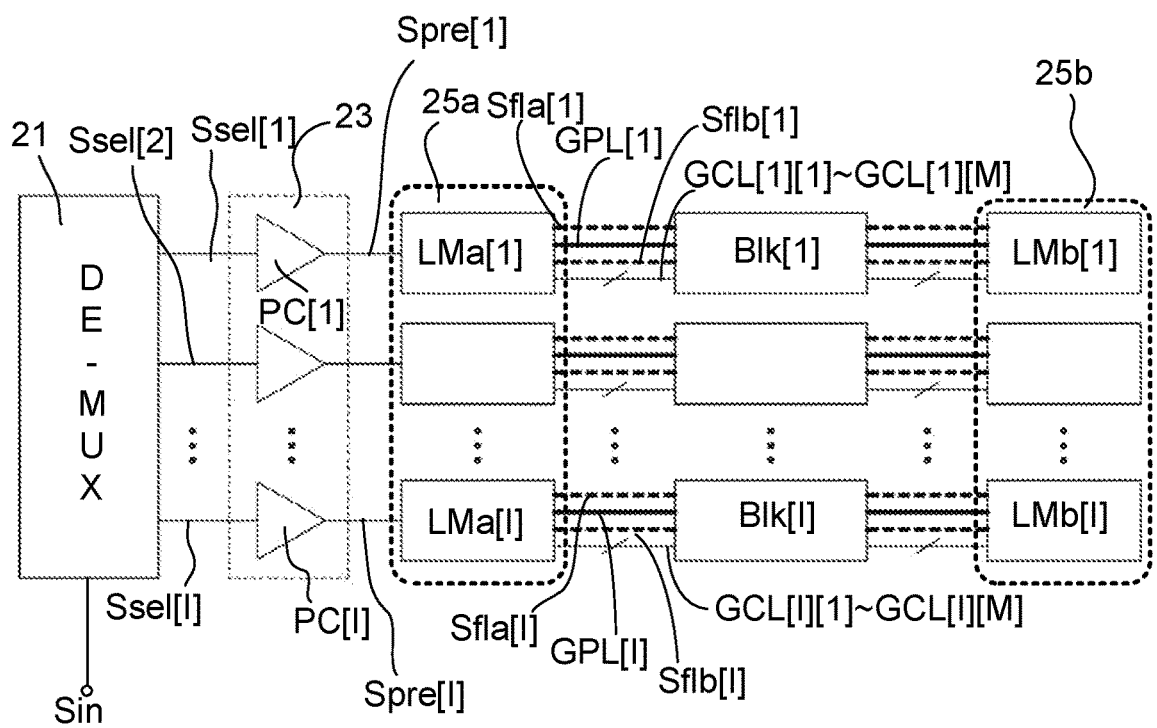
FIG. 5 is a schematic diagram showing the connection relation between the global power lines GPL and the memory blocks Blk in the memory device according to an embodiment of the invention.

Please refer to FIG. 5 which is a schematic diagram showing the connection relation between the global power lines GPL and the memory blocks Blk in the memory device according to an embodiment of the invention. The demultiplexer circuit 21 includes an input line Sin and I block selection lines Ssel[1]~Ssel[I]. The demultiplexer circuit 21 receives an input signal Sin from a memory controller (not shown), and the input signal Sin indicates which of the memory blocks Blk[1]~Blk[I] is selected for memory operation. Then, the demultiplexer circuit 21 generates the block selection signals Ssel[1]~Ssel[I] corresponding to the memory blocks Blk[1]~Blk[I].

When the block selection signal Ssel[i] represents that the memory block Blk[i] is selected, the i-th block selection line Ssel[i] is at a first logic level (e.g., logic low level L). On the contrary, when the block selection signal Ssel[i] represents that the memory block Blk[i] is unselected, the i-th block selection line Ssel [i] is at a second logic level (e.g., logic high level H).

The pre-driver module 23 includes pre-driver circuits PC[1]~PC[I] for respectively receiving the block selection signals Ssel[1]~Ssel[I] corresponding to the memory blocks Blk[1]~Blk[I]. The pre-driver circuits PC[1]~PC[I] receive the block selection signals Ssel[1]~Ssel[I], respectively, and then output corresponding pre-driving signals Spre[1]~Spre[I], respectively.

According to the concept of the invention, each memory block Blk[1]~Blk[I] is provided with one global power line GPL[1]~GPL[I]. The global power lines GPL[1]~GPL[I] transmit the pre-driving signals Spre[1]~Spre[I], respectively. Furthermore, floating lines Sfla[1]~Sfla[i] and Sflb[1]~Sflb[i] are provided at both sides of each global power line GPL[1]~GPL[I], respectively. For example, the floating lines Sfla[1] and Sflb[1] are disposed at two sides of the global power line GPL[1], and the floating lines Sfla[I] and Sflb[I] are disposed at two sides of the global power line GPL[I]. Furthermore, each memory block Blk[1]~Blk[I] includes M gate control lines GCL. For example, the memory block Blk[1] includes M gate control lines GCL[1][1]~GCL[1][M], and the memory block Blk[I] includes M gate control lines GCL[I][1]~GCL[I][M].

The local driver set 25a includes I local driver modules LMa[1]~LMa[I] corresponding to the memory blocks Blk[1]~Blk[I], respectively, and the local driver set 25b includes I local driver modules LMb[1]~LMb[I] corresponding to the memory blocks Blk[1]~Blk[I], respectively. The local driver modules LMa[1]~LMa[I] receive the pre-driving signals Spre[1]~Spre[I] from the pre-driver circuits PC[1]~PC[I] through the global power lines GPL[1]~GPL[I], respectively. Similarly, the local driver modules LMb[1]~LMb[I] receive the pre-driving signals Spre[1]~Spre[I] from the pre-driver circuits PC[1]~PC[I] through the global power lines GPL[1]~GPL[I], respectively.

Figure 6:
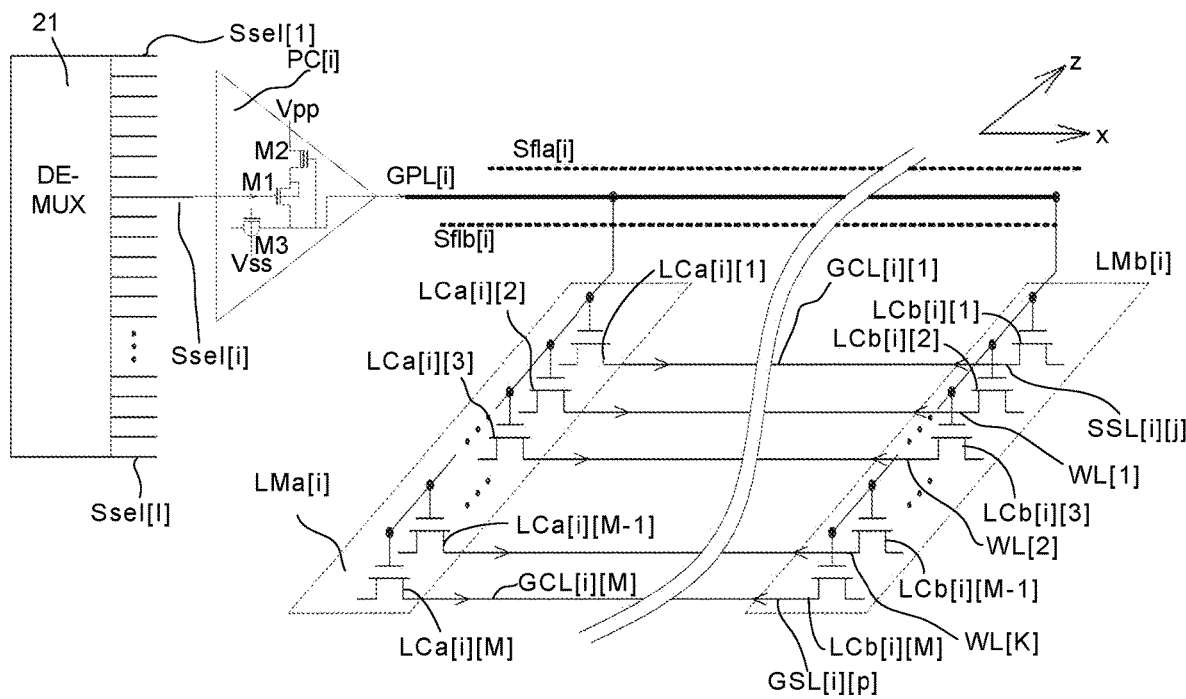
FIG. 6 is a schematic diagram illustrating the connection relation between the pre-driver circuit PC[i], the local driver modules LMa[i] and LMb[i] and the memory block Blk[i].

Please refer to FIG. 6 which is a schematic diagram illustrating the connection relation between the pre-driver circuit PC[i], the local driver module LMa[i], the local driver module LMb[i] and the memory block Blk[i]. The memory block Blk[i] is electrically connected to the pre-driver circuit PC[i] through the global power line GPL[i]. Furthermore, the floating lines Sfla[i] and Sflb[i] are disposed at two sides of the global power line GPL[i], respectively.

The local driver module LMa[i] includes M local driver circuits LCa[i][1]~LCa[i][M], and the local driver module LMb[i] includes M local driver circuits LCb[i][1]~LCb[i][M]. The local driver circuits LCa[i][1]~LCa[i][M] are electrically connected to the global power line GPL[i] through a common line, and the local driver circuits LCb[i][1]~LCb[i][M] are electrically connected to the global power line GPL[i] through another common line. Each of the local driver circuits LCa[i][1]~LCa[i][M] and LCb[i][1]~LCb[i][M] may be a local driver transistor.

The memory block Blk[i] includes M gate control lines GCL[i][1]~GCL[i][M]. One portion of the gate control lines GCL[i][1]~GCL[i][M] function as string selection lines SSL[i][1]~SSL[i][J], another portion function as word lines WL[1]~WL[K], and the other portion function as ground selection lines GSL[i][1]~GSL[i][P] (only ground selection line GL[i][p] is shown in FIG. 6). The local driver circuits LCa[i][1]~LCa[i][M] are electrically connected to the gate control lines GCL[i][1]~GCL[i][M], respectively, and the local driver circuits LCb[i][1]~LCb[i][M] are electrically connected to the gate control lines GCL[i][1]~GCL[i][M], respectively.

The pre-driver circuits PC[1]~PC[I] have a similar structure to each other, and only the pre-driver circuit PC[i] is exemplified here. The pre-driver circuit PC[i] includes pre-driver transistors M1, M2 and M3, and all of which are high-voltage tolerant transistors. The pre-driver transistor M1 is a PMOS transistor, and the pre-driver transistors M2 and M3 are NMOS transistors. Furthermore, the pre-driver transistor M2 is a depletion mode transistor, and the pre-driver transistor M3 is a conventional NMOS transistor or a triple well NMOS transistor.

The pre-driver transistor M1 is electrically connected to the block selection line Ssel[i], and the pre-driver transistor M2 is electrically connected to the pre-driver transistor M1 and the global power line GPL[i]. The pre-driver transistor M2 receives a first power voltage Vpp from a first power source Vpp. The pre-driver transistor M3 is electrically connected to the pre-driver transistor M1 and the global power line GPL[i]. The pre-driver transistor M3 receives a second power voltage Vss from a second power source Vss. The source and the body of the pre-driver transistor M1 are electrically connected to each other, and the drain of the pre-driver transistor M1 and the gate of the pre-driver transistor M2 are electrically connected to the global power line GPL[i].

In the embodiment, the first power voltage Vpp is higher than the read voltage Vrd, the write voltage Vwr and the erase voltage Vers of the memory, while the second power voltage Vss is lower than the read voltage Vrd, the write voltage Vwr and the erase voltage Vers of the memory. In some cases, the read voltage Vrd and the erase voltage Vers may be lower than the ground voltage (0V). In this condition, the second power voltage Vss is a negative voltage. Since the second power voltage Vss is kept at the lowest level, abnormal forward turn-on of the transistors can be inhibited. Furthermore, all the NMOS transistors (e.g., local driver circuits LCa, LCb, and pre-driver transistor M1) whose body are electrically connected to the negative voltage Vss should be triple well NMOS transistors. Such an arrangement can avoid influence on other NMOS transistors in the same memory device.

Before the memory controller selects one of the memory blocks Blk[1]~Blk[I], all of the block selection signals Ssel[1]~Ssel[I] outputted by the demultiplexer circuit 21 are at the logic high level H. Then, if the input signal Sin represents that the memory block Blk[i] is selected by the memory controller, the demultiplexer circuit 21 outputs the block selection signal Ssel[i] at the logic low level L and other block selection signals Ssel[1]~Ssel[i−1] and Ssel[i+1]~Ssel[I] at the logic high level H. For example, the logic high level H is 4V and the logic low level L is 0V.

Figure 7A:
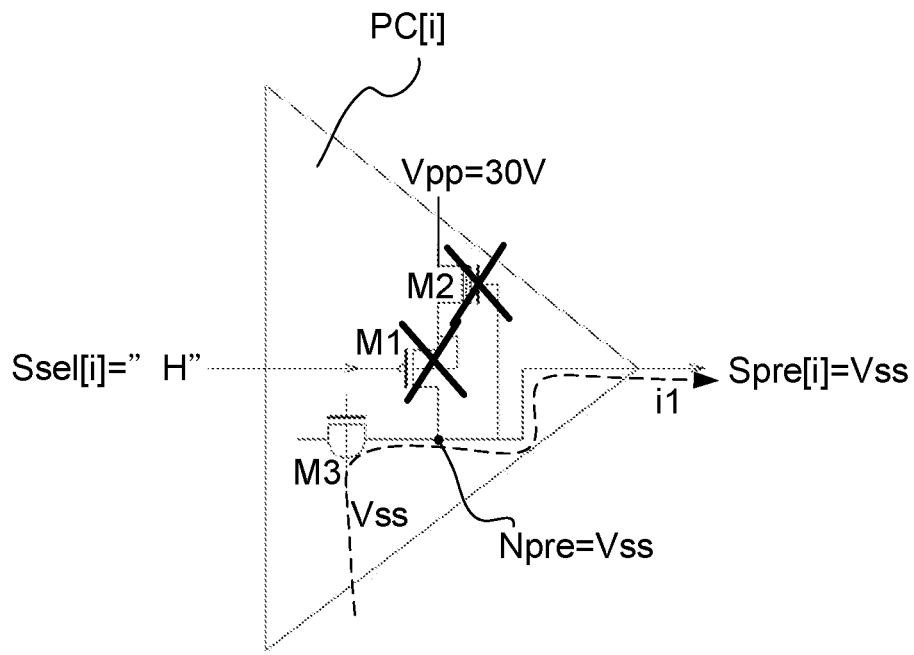
FIGS. 7A and 7B are schematic diagrams showing the operation of the pre-driver circuit in response to a high level and a low level of the block selection signal, respectively.
Figure 7B:
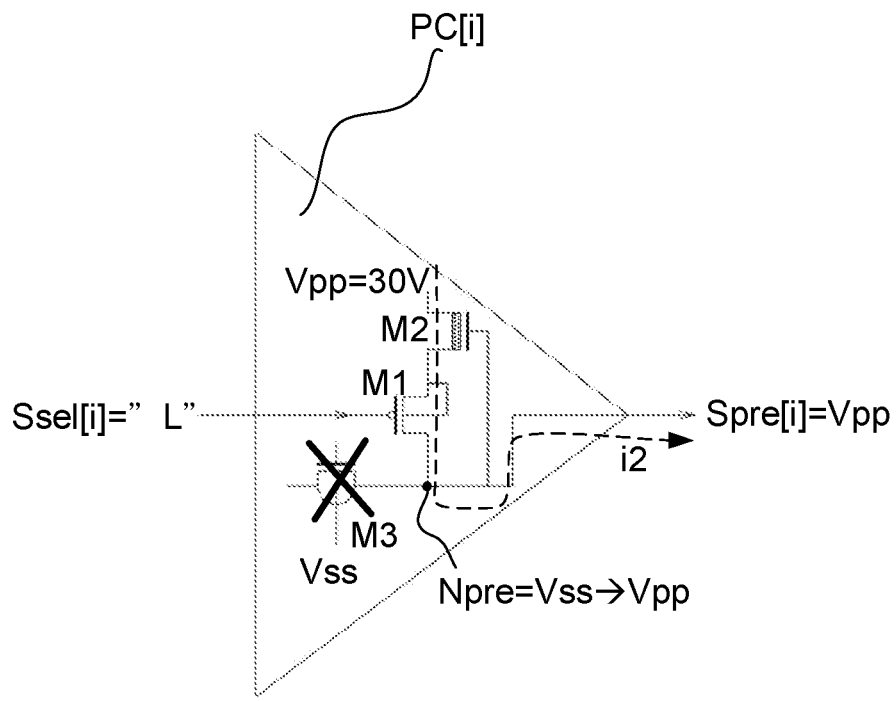

Please refer to FIGS. 7A and 7B which are schematic diagrams showing the operation of the pre-driver circuit PC[i] electrically connected to the memory block Blk[i]. The memory block Blk[i] is unselected in FIG. 7A and the memory block Blk[i] is selected in FIG. 7B. As shown in FIGS. 7A and 7B, no matter whether the memory block Blk[i] is selected, the pre-driver transistor M1 receives the first power voltage Vpp (e.g., 30V), and the pre-driver transistor M3 receives the second power voltage Vss.

In FIG. 7A, the pre-driver transistor M3 receives the second power voltage Vss (pre-charge voltage), and the pre-driver transistor M1 receives the first power voltage Vpp. The voltage of the pre-charge node Npre is equal to the second power voltage Vss. When the block selection signal Ssel[i] is at the logic high level H, the pre-driver transistors M1 and M2 are kept switched off, and only the pre-driver transistor M3 is switched on.

Therefore, when the memory block Blk[i] is unselected, the pre-driver circuit PC[i] generates a displacement current i1 due to charge unbalance inside the pre-driver circuit PC[i]. Thus, the voltage of the pre-driving line Spre[i] electrically connected to the pre-charge node Npre is the second power voltage Vss which will be transmitted to the global power line GPL[i] through the pre-driver transistor M3. Then, the local driver module LMa[i] and the local driver module LMb[i] corresponding to the memory block Blk[i] receive the second power voltage Vss from the global power line GPL[i]. As a consequence, the memory block Blk[i] takes no action. Incidentally, the displacement current i1 lasts until voltage balance (Spre=Vss).

In FIG. 7B, the pre-driver transistor M3 receives the second power voltage Vss (pre-charge voltage), and the pre-driver transistor M1 receives the first power voltage Vpp. The voltage of the pre-charge node Npre is equal to the second power voltage Vss at first. When the block selection signal Ssel[i] is at the logic low level L, the pre-driver transistors M2 is partially switched on because the pre-driver transistor M2 is a depletion mode transistor and the threshold voltage Vth thereof is lower than 0V.

Considering the pre-driver transistor M1, because the gate receives the logic low voltage L, and the source gradually receives the first power voltage Vpp through the partially switched on pre-driver transistor M2, the pre-driver transistor M1 presents a weak turn-on state. At this time, the drain voltage of the pre-driver transistor M1 is transmitted to the pre-charge node Npre. The voltage of the pre-charge node Npre also affects the gate voltage of the pre-driver transistor M2 to allow more current to pass therethrough. Such loop leads to the positive feedback of current between the pre-driver transistors M1 and M2.

After the pre-driver transistors M1 and M2 are fully switched on, the voltage of the pre-charge node Npre is raised to the first power voltage Vpp at final, and the pre-driver transistor M3 does not conduct current. In this condition, the gate of the pre-driver transistor M1 receives 0V, and the source and the N-well are electrically connected to the first power voltage Vpp. Therefore, the pre-driver transistor M1 should be a transistor with a higher breakdown voltage. For example, the pre-driver transistor M1 has a thicker gate oxide than other PMOS transistor.

When the memory block Blk[i] is selected, the pre-driver circuits PC[i] generates a displacement current i2. Thus, the voltage of the pre-driving line Spre[i] electrically connected to the pre-charge node Npre is equal to the first power voltage Vpp. Since the pre-driving line Spre[i] is electrically connected to the global power line GPL[i], the local driver modules LMa[i] and LMb[i] correspond to the memory block Blk[i] can receive the first power voltage Vpp from the global power line GPL[i]. Thus, the memory controller can control the selected memory block Blk[i] to perform a desired memory operation.

As described above, when the block selection signal Ssel[i] outputted by the demultiplexer circuit 21 is at a logic low level L, it represents that the memory block Blk[i] is selected. Accordingly, the pre-driver circuit PC[i] outputs the first power voltage Vpp to the global power line GPL[i] corresponding to the memory block Blk[i]. On the contrary, when the block selection signal Ssel[i] outputted by the demultiplexer circuit 21 is at a logic high level H, it represents that the memory block Blk[i] is unselected. Accordingly, the pre-driver circuit PC[i] outputs the second power voltage Vss to the global power line GPL[i] corresponding to the memory block Blk[i].

It is to be noted that the first power voltage Vpp is the highest voltage provided in the memory device. To avoid damage of the memory device due to great voltage difference between the global power line GPL[i] corresponding to the selected memory block Blk[i] and neighboring signal lines, floating lines Sfla[i] and Sflb[i] are disposed at two sides of the global power line GPL[i]. The floating lines Sfla[i] and Sflb[i] can reduce the influence of the high-voltage global power line GPL[i] on the neighboring signal lines.

Figure 8:
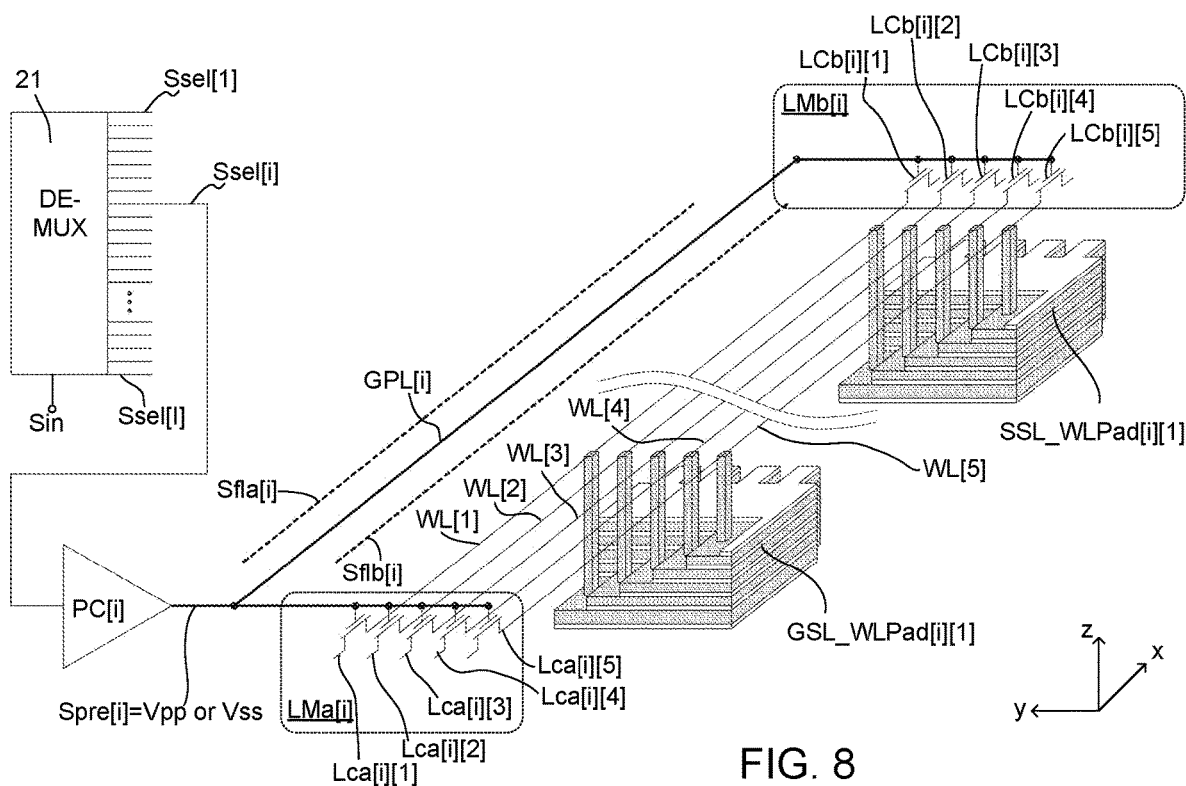
FIG. 8 is a schematic diagram illustrating that the global power line GPL is provided in the three-dimensional memory device wherein the word lines WL function as the gate control lines GCL.

Please refer to FIG. 8 which is a schematic diagram illustrating the stair structure of the word line pads WLPad and the global power line GPL in the three-dimensional memory device. The demultiplexer circuit 21 is electrically connected to the pre-driver circuit PC[i] through the block selection line Ssel[i], and the pre-driver circuit PC[i] is electrically connected to the local driver modules LMa[i] and LMb[i] through the global power line GPL[i]. The pre-driver circuit PC[i] outputs the pre-driving signal Spre[i] to the global power line GPL[i], and the pre-driving signal Spre[i] can be a first power voltage Vpp or a second power voltage Vss. In this example, the local driver module LMa[i] includes local driver circuits LCa[i][1]~LCa[i][5], and the local driver module LMb[i] includes local driver circuits LCb[i][1]~LCb[i][5]. In particular, the local driver circuit LCa[i][1] and the local driver circuit LCb[i][1] are electrically connected to the word line pad WLPad[1] in the stair structures; the local driver circuit LCa[i][2] and the local driver circuit LCb[i][2] are electrically connected to the word line pad WLPad[2] in the stair structures; and the rest may be deduced by analogy.

As described above, in addition to the word lines WL[1]~WL[K], the gate control lines GCL[i][1]~GCL[i][M] further include the string selection lines SSL[i][1]~SSL[i][J] and the ground selection lines GSL[i][1]~GSL[i][P]. The j-th memory string ST[i][j] of the memory block Blk[i] includes a string selection transistor SSM[i][j], K memory cells MC[i][j][1]~MC[i][j][K] and a ground selection transistor GSM[i][j]. The memory cells MC[i][j][1]~MC[i][j][K] may be non-volatile memory elements such as floating-gate transistors or charge trapping devices. In real practice, the type of the memory cells MC[i][j][1]~MC[i][j][K] is not limited to the embodiment.

Figure 9:
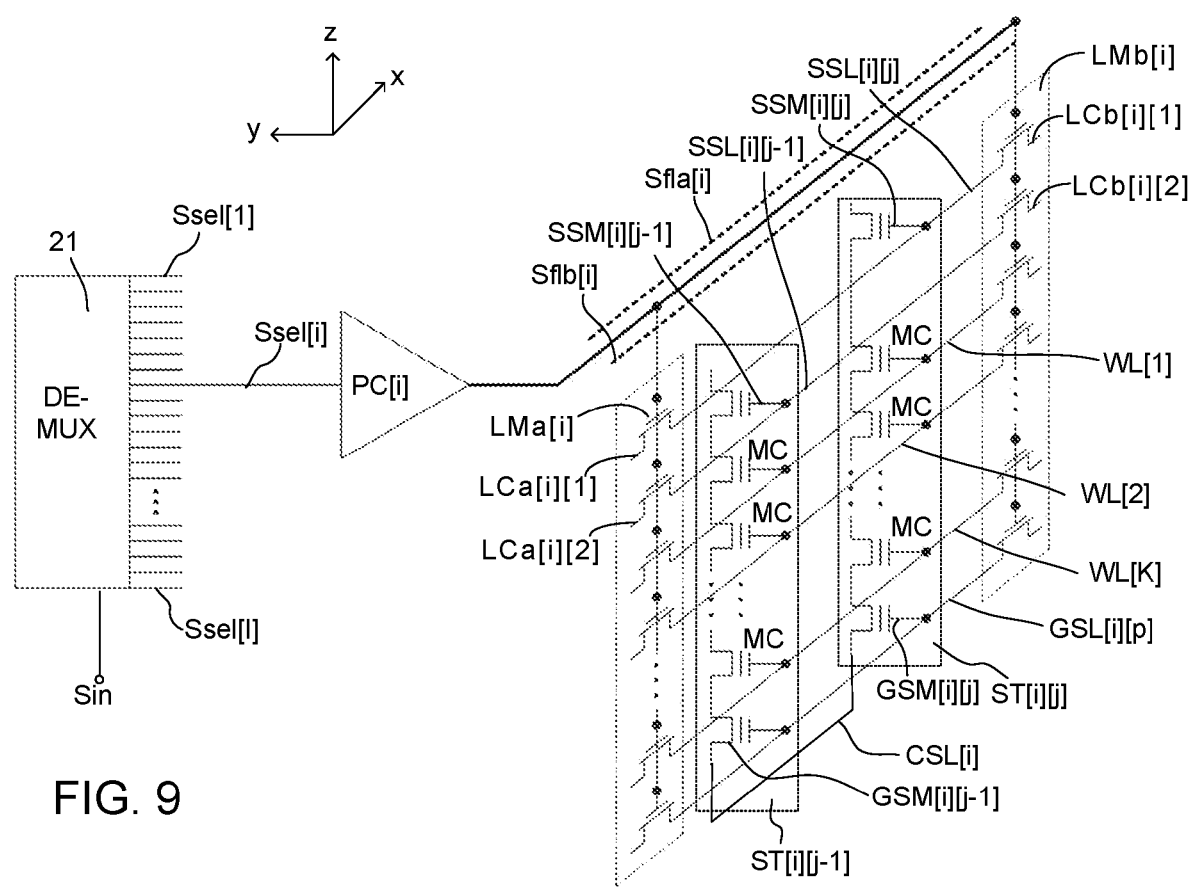
FIG. 9 is a schematic diagram illustrating that the global power line GPL is electrically connected to the string selection transistors SSM and the memory cells MC through the gate control lines GCL.

Please refer to FIG. 9 which is a schematic diagram illustrating that the global power line GPL[i] is electrically connected to the string selection transistors SSM and the memory cells MC through the gate control lines GCL. FIG. 9 simply shows the connection between the transistor units and the signal lines in the memory block Blk[i].

The memory block Blk[i] includes memory strings ST[i][1]~ST[i][J], but only the memory strings ST[i][j−1] and ST[i][j] are shown for illustration purposes. The memory string ST[i][j−1] includes a string selection transistor SSM[i][j−1], K memory cells MC[i][j−1][1]~MC[i][j−1][K] electrically connected to the word lines WL[1]~WL[K] and a ground selection transistor GSM[i][j−1]. Similarly, the memory string ST[i][j] includes a string selection transistor SSM[i][j], K memory cells MC[i][j][1]~MC[i][j][K] electrically connected to the word lines WL[1]~WL[K] and a ground selection transistor GSM[i][j].

Accordingly, the memory string ST[i][j] (j=1~J) of the memory block Blk[i] corresponds to one string selection transistor SSM[i][j], K memory cells MC[i][j][1]~MC[i][j][K] and one ground selection transistor GSM[i][j]. In the memory block Blk[i], the gates of the ground selection transistors GSM[i][j−1] and GSM[i][j] belonging to different memory strings ST[i][j−1] and ST[i][j] are electrically connected to P ground selection lines GSL[i][1]~GSL[i][P] (for the sake of illustration, P=1 in this diagram, but is not limited to this value). Furthermore, in the memory block Blk[i], the ground selection transistors GSM[i][j−1] and GSM[i][j] belonging to different memory strings ST[i][j−1] and ST[i][j] are electrically connected to a common source line CSL[i].

In a case that P≠1, the J memory strings can be classified into P string groups, wherein J is greater than or equivalent to P. The gates of the ground selection transistors GSM[i][j] belong to the same string group are jointly connected to the same ground selection line GSL[i][p]. For example, by assuming J is an even number and P=2, the J memory strings are classified into 2 string groups, a first string group including the memory strings ST[i][1]~ST[i][J/2], and a second string group including the memory string ST[i][J/2+1]~ST[i][J]. Accordingly, the gates of the ground selection transistors GSM[i][1]~GSM[i][J/2] belong to the memory strings ST[i][1]~ST[i][J/2] are jointly electrically connected to the ground selection line GSL[i][1], and the gates of the ground selection transistors GSM[i][J/2+1]~GSM[i][J] belong to the memory strings ST[i][J/2+1]~ST[i][J] are jointly electrically connected to the ground selection line GSL[i][2].

The string selection transistors SSM[i][j−1] and SSM[i][j] of the memory strings ST[i][j−1] and ST[i][j] are arranged at different heights in FIG. 9. It is to be noted that such arrangement is just used for illustrating the connection relation between the transistor units and the local driver circuits LCa and LCb. In real practice, the string selection transistors SSM[i][j−1] and SSM[i][j] of the memory strings ST[i][j−1] and ST[i][j] are arranged at equal height.

Depending on the connection manner between the memory strings ST, there are two types of flash memories, bottom source structure and U-turn string structure. The invention can be applied to both structures of the flash memories. As illustrated above, the memory block Blk[i] may include J memory strings being classified into P groups. For the bottom source structure, the memory strings are usually classified into 2 groups (that is, P=2) while manufacturing the memory because the ground selection lines GSL are formed at the bottom of the memory structure. On the other hand, for the U-turn string structure, shallow etching can be used to divide the ground selection line into P parts having equal lengths (that is, P can be any positive integer). In consequence, the memory strings of the U-turn string structure memory can be freely classified into different groups during the manufacture process.

Figures 10A, 10B:
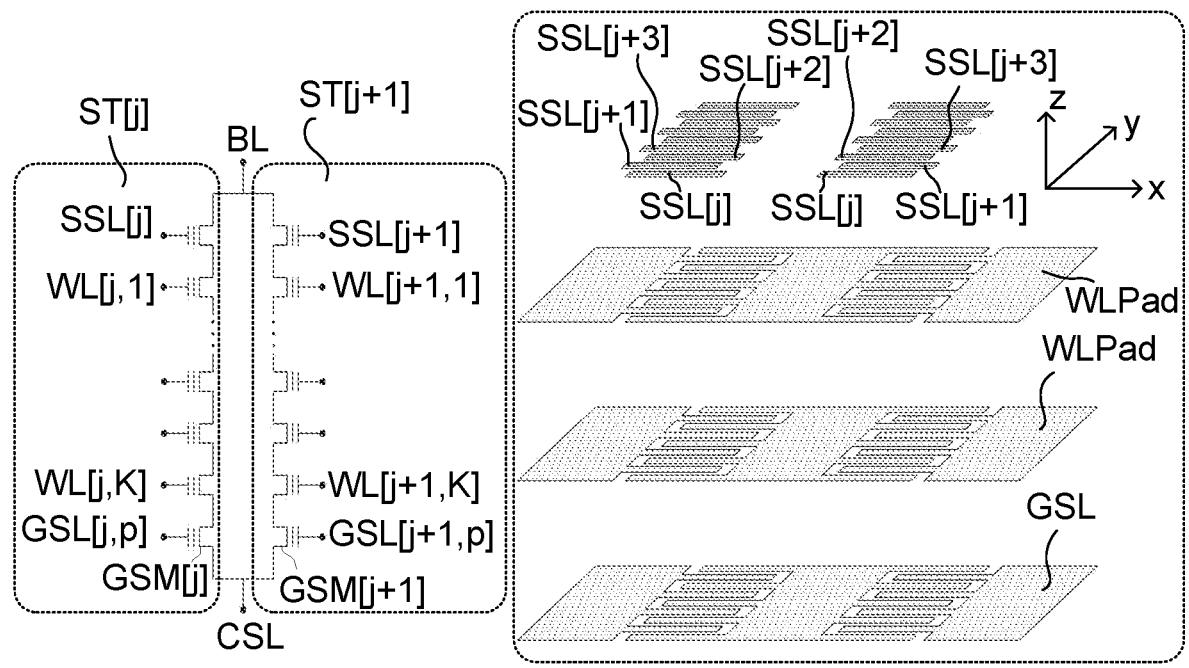
FIG. 10A is a schematic diagram illustrating the memory strings in the bottom source structure.
FIG. 10B is a schematic diagram illustrating stacked layers in the bottom source structure.

Please refer to FIG. 10A which is a schematic diagram illustrating the memory strings in the bottom source structure. In the bottom source structure, one column of transistor units forms one memory string. Two memory strings STU[j] and ST[j+1] are shown in this diagram. The memory string ST[j] includes one string selection transistor SSM electrically connected to the string selection line SSL[j], K memory cells MC respectively electrically connected to the word lines WL[j,1]~WL[j,K] and one ground selection transistor GSM[j] electrically connected to the ground selection line GSL[j, p]. The memory string ST[j+1] includes one string selection transistor SSM electrically connected to the string selection line SSL[J+1], K memory cells MC respectively electrically connected to the word lines WL[j+1,1]~WL[j+1,K] and one ground selection transistor GSM[j+1] electrically connected to the ground selection line GSL[j+1, p]. In this diagram, the word lines WL[j,1]~WL[j,K] corresponding to the memory string ST[j] and the word lines WL[j+1,1]~WL[j+1,K] corresponding to the memory string ST[j+1] are arranged in two different sets of word line pads WLPad. Similarly, the ground selection line GSL[j, p] corresponding to the memory string ST[j] and the ground selection line GSL[j+1, p] corresponding to the memory string ST[j+1] belong to two ground selection layers GSL independent of each other.

Please refer to FIG. 10B which is a schematic diagram illustrating stacked layers in the bottom source structure. The word line pads WLPad and the ground selection layer GSL are parallel to each other. The string selection lines SSL[j], SSL[j+1], SSL[+2], SSL[j+3] are arranged alternately in a staggered way above the word line pads WLPad and the ground selection layer GSL.

Figure 11:
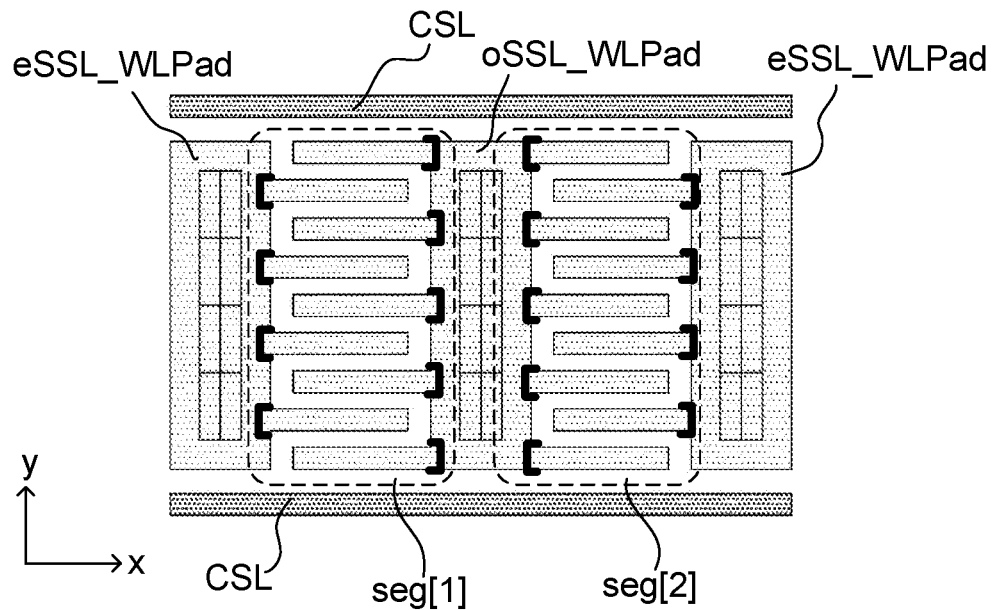
FIG. 11 is a top view illustrating a memory block having the bottom source structure.

Please refer to FIG. 11 is a top view illustrating a memory block having the bottom source structure. The memory block Blk[i] includes string selection-word line pads eSSL_WLPad and oSSL_WLPad. The string selection-word line pads eSSL_WLPad form the memory strings in the even columns, and the string selection-word line pads oSSL_WLPad form the memory strings in the odd columns. The finger-type structure of the string selection-word line pad eSSL_WLPad and the finger-type structure of the string selection-word line pad oSSL_WLPad are arranged in a staggered way. At the staggered portion of the string selection-word line pads eSSL_WLPad and oSSL_WLPad, segments seg[1] and seg[2] are formed. In addition, common source plates CSL to be connected to the sources of the ground selection transistors GSM are provided at two sides of the memory block Blk[i].

Please refer to FIG. 12A which is a schematic diagram illustrating the gate control lines GCL of the memory block Blk[i]. As described above, the gate control lines GCL[i][1]~GCL[i][M] serve as the string selection lines SSL, the word lines WL and the ground selection lines GSL.

Please refer to FIG. 12B which is a schematic diagram illustrating the global power line GPL and the floating lines corresponding to the memory block Blk[i]. The global power line GPL[i] and the floating lines Sfla[i] and Sflb[i] are parallel to each other. The floating lines Sfla[i] and Sflb[i] are disposed at two sides of the global power line GPL[i], respectively.

The memory block Blk[i] in FIG. 11 is combined with the gate control lines GCL[i][1]~GCL[i][M] in FIG. 12A and the global power line GPL[i] and the floating lines Sfla[i] and Sflb[i] in FIG. 12B, and a top view of the resultant structure is shown in FIG. 13.

Figure 14A:
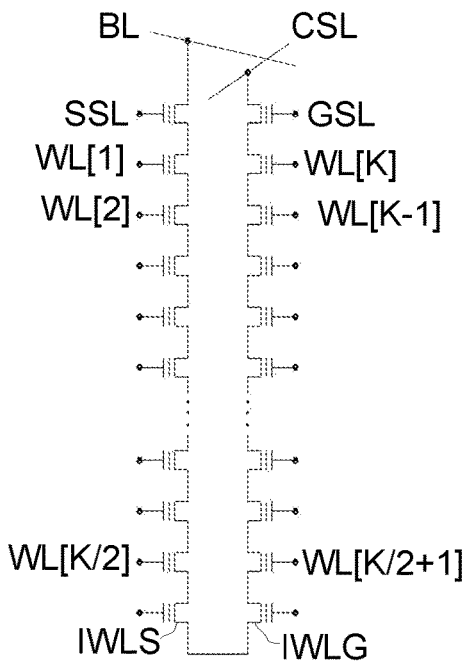
FIG. 14A is a schematic diagram illustrating the memory string in the U-turn string structure.

Please refer to FIG. 14A which is a schematic diagram illustrating the memory string in the U-turn string structure. In the U-turn string structure, two columns of transistor units form one memory string. One memory string ST is shown in this diagram. The memory string ST includes one string selection transistor SSM electrically connected to the string selection line SSL, K memory cells MC respectively electrically connected to the word lines WL[1]~WL[K], one ground selection transistor GSM electrically connected to the ground selection line GSL and two pass transistors IWLS and IWLG. The pass transistors IWLS and IWLG are not used for storing data, but transferring voltage level between the memory cells. The pass transistor IWLS or IWLG is also called as inversion gate or inversion word line.

The control terminal of the string selection transistor SSM is electrically connected to the string selection line SSL, and other two terminals are electrically connected to the memory cells MC controlled by the word line WL[1] and the bit line BL, respectively. The control terminal of the ground selection transistor GSM is electrically connected to the ground selection line GSL, and other two terminals are electrically connected to the memory cells MC controlled by the word line WL[K] and the common source line CSL, respectively.

Figure 14B:
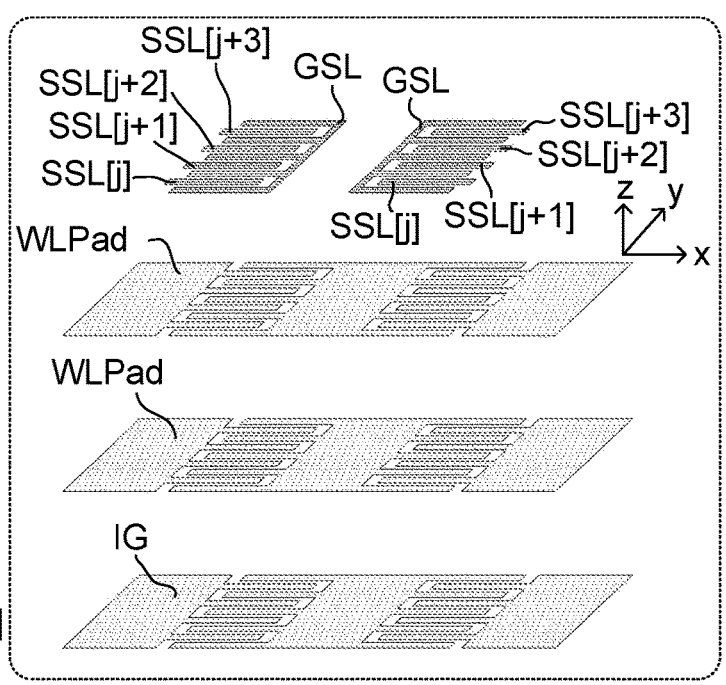
FIG. 14B is a schematic diagram illustrating stacked layers in the U-turn string structure.

Please refer to FIG. 14B which is a schematic diagram illustrating stacked layers in the U-turn string structure. The word line pads WLPad and the inversion gate layer IG are parallel to each other. The string selection lines SSL[j], SSL[j+1], SSL[j+2], SSL[j+3] and the ground selection lines GSL are arranged alternately in a staggered way above the word line pads WLPad. The ground selection lines GSL in one segment extend along the x-direction and are electrically connected together at one side.

Figure 15:
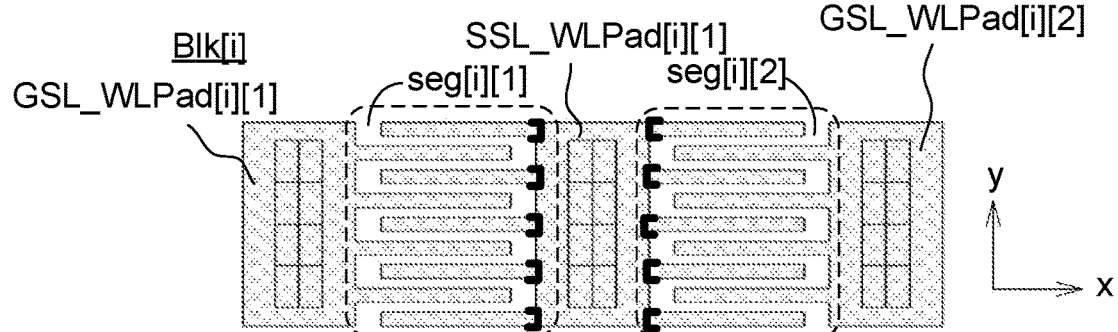
FIG. 15 is a top view illustrating a memory block having the U-turn string structure.

Please refer to FIG. 15 which is a top view illustrating a memory block having the U-turn string structure. The memory block Blk[i] includes ground selection-word line pads GSL_WLPad[i][1] and GSL_WLPad[i][2] and a string selection-word line pad SSL_WLPad[i][1]. The finger-type structure of the ground selection-word line pads GSL_WLPad[i][1] or GSL_WLPad[i][2] and the finger-type structure of the string selection-word line pad SSL_WLPad[i][1] are arranged in a staggered way. At the staggered portion of the ground selection-word line pads GSL_WLPad[i][1] and GSL_WLPad[i][2] and the string selection-word line pad SSL_WLPad[i][1], segments seg[i][1] and seg[i][2] are formed.

Figure 16:
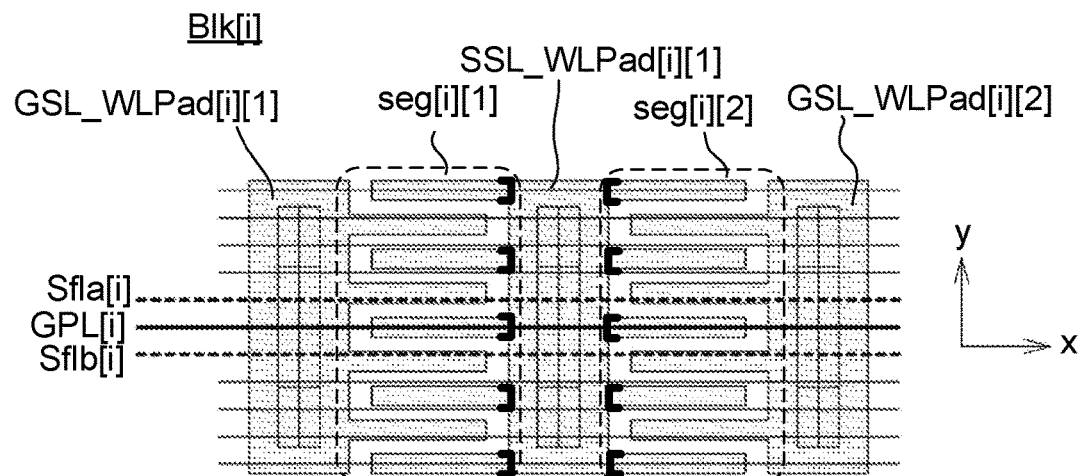
FIG. 16 is a top view illustrating that the memory block in FIG. 15 is combined with the gate control lines GCL in FIG. 12A and the global power line GPL and the floating lines in FIG. 12B.

The memory block Blk[i] in FIG. 15 is combined with the gate control lines GCL[i][1]~GCL[i][M] in FIG. 12A and the global power line GPL[i] and the floating lines Sfla[i] and Sflb[i] in FIG. 12B, and a top view of the resultant structure is shown in FIG. 16.

The following description describes how the concept of the invention is applied to memory blocks. According to the invention, many sets of global power lines GPL[1]~GPL[I] and floating lines Sfla[1]~Sfla[I] and Sflb[1]~Sflb[I] are disposed on the memory blocks Blk[1]~Blk[I], respectively.

Figure 17:
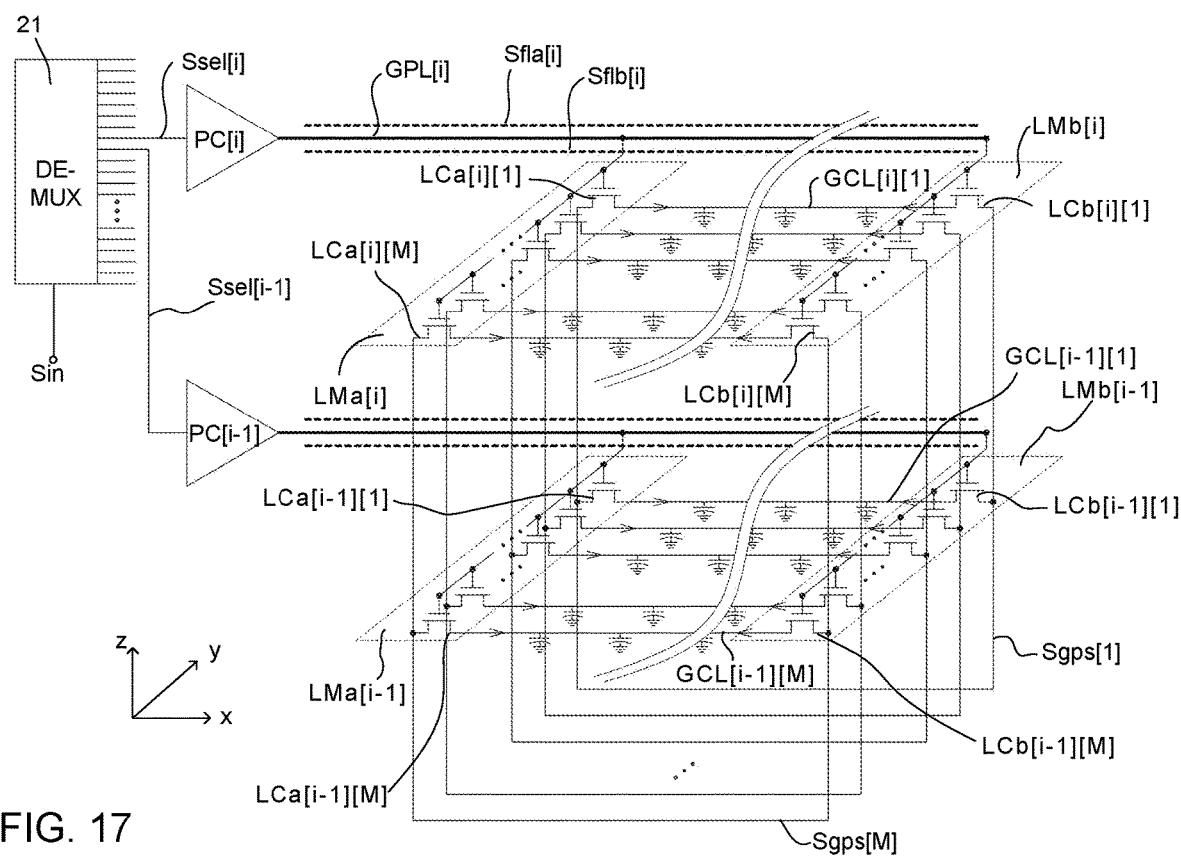
FIG. 17 is a schematic diagram illustrating the connection relation of the memory blocks in the memory device according to an embodiment of the invention.

Please refer to FIG. 17 which is a schematic diagram illustrating the connection relation of the memory blocks in the memory device according to an embodiment of the invention. The connection relations between the global power line GPL, the floating lines Sfla and Sflb and the memory blocks Blk are clearly shown.

With regard to the memory block Blk[i−1], the demultiplexer circuit 21 outputs the block selection signal Ssel[i−1] to the pre-driver circuit PC[i−1] electrically connected to the global power line GPL[i−1]. The global power line GPL[i−1] is further electrically connected to the local driver modules LMa[i−1] and LMb[i−1]. The local driver circuits LCa[i−1][1]~LCa[i−1][M] of the local driver module LMa[i−1] and the local driver circuits LCb[i−1][1]~LCb[i−1][M] of the local driver module LMb[i−1] provide control voltages to the gates of the corresponding transistor units through the gate control lines GCL[i−1][1]~GCL[i−1][M], respectively.

With regard to the memory block Blk[i], the demultiplexer circuit 21 outputs the block selection signal Ssel[i] to the pre-driver circuit PC[i] electrically connected to the global power line GPL[i]. The global power line GPL[i] is further electrically connected to the local driver modules LMa[i] and LMb[i]. The local driver circuits LCa[i][1]~LCa[i][M] of the local driver module LMa[i] and the local driver circuits LCb[i][1]~LCb[i][M] of the local driver module LMb[i] provide control voltages to the gates of the corresponding transistor units through the gate control lines GCL[i][1]~GCL[i][M], respectively.

In particular, the sources of the local driver circuits LCa[i−1][1]~LCa[i−1][M] of the local driver module LMa[i−1] are electrically connected to the global source lines Sgps[1]~Sgps[M], respectively; and the sources of the local driver circuits LCa[i][1]~LCa[i][M] of the local driver module LMa[i] are electrically connected to the global source lines Sgps[1]~Sgps[M], respectively. On the other hand, the sources of the local driver circuits LCb[i−1][1]~LCb[i−1][M] of the local driver module LMb[i−1] are electrically connected to the global source lines Sgps[1]~Sgps[M], respectively; and the sources of the local driver circuits LCb[i][1]~LCb[i][M] of the local driver module LMb[i] are electrically connected to the global source lines Sgps[1]~Sgps[M], respectively. In the embodiment, drains of the local driver circuits LCa and LCb of the local driver modules LMa and LMb are floating drains, and the voltage level of the drains will become equal to the voltage level of the sources eventually.

Figure 18A:
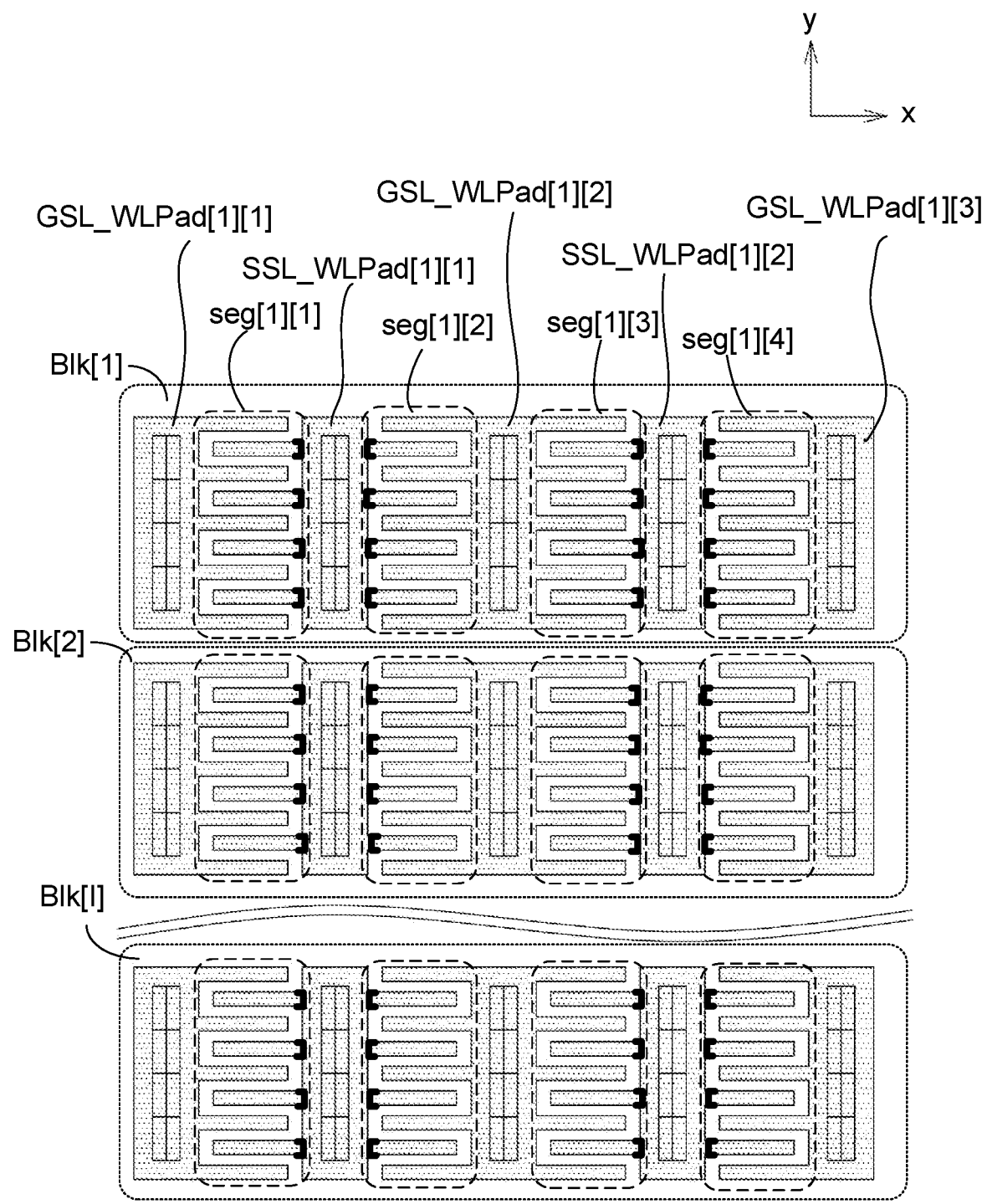
FIG. 18A is a top view illustrating the memory blocks of the memory device.
Figure 18B:
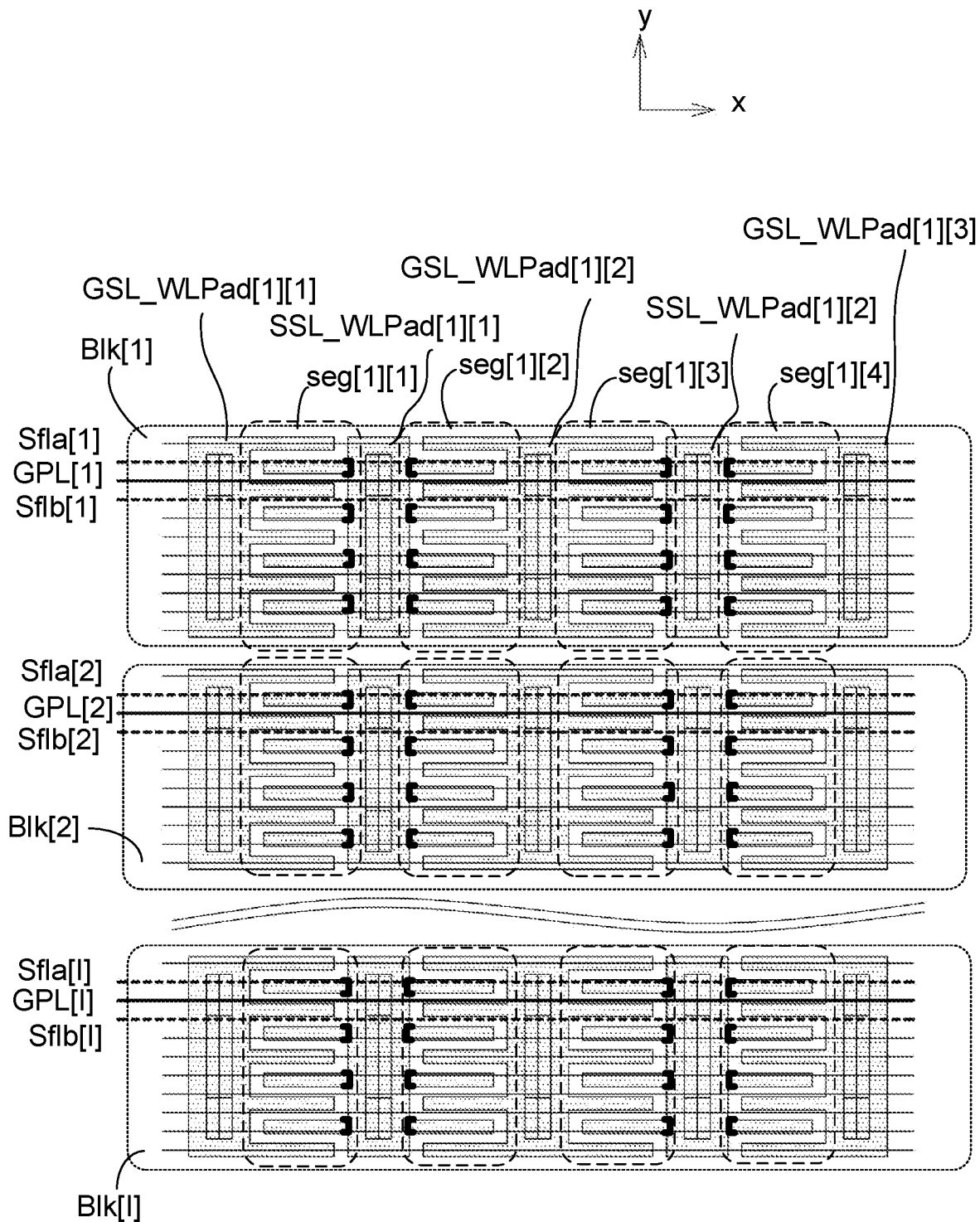
FIG. 18B is a top view illustrating that the memory blocks in FIG. 18A are combined with the gate control lines GCL, the global power lines GPL and the floating lines.

FIGS. 18A and 18B are top views illustrating the application of the invention to memory blocks of the memory device. From FIGS. 12A, 12B, 13, 15 and 16, considering both the bottom source structure and the U-turn string structure, although there is difference in the position and connection relation of the string selection line SSL, the common source line CSL and the ground selection line GSL, the relative position and connection of the word line pads and the string selection lines SSL in both structures are similar. Hence, only memory blocks Blk with the U-turn string structure are illustrated here, but the bottom source structure can be deduced from the description.

Please refer to FIG. 18A which is a top view illustrating the memory blocks having the U-turn string structure. Each of the memory blocks Blk[1]~Blk[I] includes a plurality of segments and word line pads. For example, the memory block Blk[1] includes ground selection-word line pads GSL_WLPad[1][1], GSL_WLPad[1][2] and GSL_WLPad[1][3] and string selection-word line pads SSL_WLPad[1][1] and SSL_WLPad[1][2]. For one U-turn string, the finger-type structures of the ground selection-word line pad GSL_WLPad and the string selection-word line pad SSL_WLPad are arranged in a staggered way, and the staggered portions form the segment. For example, the staggered portions of the ground selection-word line pads GSL_WLPad[1][1]~GSL_WLPad[1][3] and the string selection-word line pads SSL_WLPad[1][1] and SSL_WLPad[1][2] form the segments seg[1][1], seg[1][2], seg[1][3] and seg[1][4] in the memory block Blk[1].

Please refer to FIG. 18B which is a top view illustrating that the memory blocks in FIG. 18A are combined with the gate control lines GCL, the global power lines GPL and the floating lines Sfla and Sflb. The relations between the global power lines GPL[i], the floating lines Sfla[i] and Sflb[i] and the memory blocks Blk[i] for i=1~I are clearly shown. For example, the global power line GPL[1] and the floating lines Sfla[1] and Sflb[1] are disposed on the memory block Blk[1]; the global power line GPL[2] and the floating lines Sfla[2] and Sflb[2] are disposed on the memory block Blk[2]; and the global power line GPL[I] and the floating lines Sfla[I] and Sflb[I] are disposed on the memory block Blk[I].

According to the concept of the invention, the gate control lines GCL[i][1]~GCL[i][M] of one memory block Blk[i] cooperates with one global power line GPL[i] and two floating lines Sfla[i] and Sflb[i]. Each of the gate control lines GCL[i][1]~GCL[i][M] may function as one of the string selection lines SSL[i][1]~SSL[i][J], the word lines WL[i][1]~WL[i][K] and the ground selection lines GSL[i][1]~GSL[i][P]. The number of the transistor units electrically connected to respective gate control lines GCL[i][1]~GCL[i][M] varies depending on the role of the gate control line GCL. If the gate control line GCL[i][m] is a string selection line SSL, there is one string selection transistor electrically connected to the string selection line SSL. If the gate control line GCL[i][m] is a ground selection line GSL[i][1]~GSL[i][P], there are J/P ground selection transistors electrically connected to each of the ground selection lines GSL[i][1]~GSL[i][P]. If the control line GCL[i][m] is a word line WL, there are N memory cells MC connected to the word line WL wherein N represents the quantity of the bit lines in the memory block Blk[i].

In conclusion, the invention takes advantages of the global power lines GPL[1]~GPL[I] to rapidly pull up the voltage of the gate control lines GCL corresponding to the selected memory block. In other words, such design can compensate for adverse RC delay resulting from increased area of the word line pads.

While the invention has been described by way of example and in terms of the preferred embodiment(s), it is to be understood that the invention is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A memory device comprising:
   I memory blocks, an i-th memory block selected from the I memory blocks comprising:
      M gate control lines; and
      a plurality of transistor units arranged in M rows wherein gates of the transistor units in an m-th row selected form the M rows are electrically connected to an m-th gate control line selected from the M gate control lines;
   I global power lines electrically connected to the I memory blocks, respectively; and
   I first local driver modules electrically connected to the I global power lines and the I memory blocks, respectively, wherein an i-th first local driver module selected from the I first local driver modules is electrically connected to an i-th global power line selected from the I global power lines and the i-th memory block, the i-th first local driver module comprising:
      M first local driver circuits electrically connected to the i-th global power line, wherein an m-th first local driver circuit selected from the M first local driver circuits is electrically connected to the m-th gate control line, wherein m, M, i and I are integers, m is less than or equal to M, and i is less than or equal to I.

2. The memory device according to claim 1, further comprising:
   a demultiplexer circuit having an input line and I block selection lines corresponding to the I memory blocks, respectively, the demultiplexer circuit receiving an input signal through the input line, and determining logical levels of the I block selection lines, wherein one of the I block selection lines is at a first logic level, and others of the I block selection lines are at a second logic level; and
   a pre-driver module electrically connected to the demultiplexer circuit, and comprising:
      I pre-driver circuits electrically connected to the I block selection lines and I first local driver modules, respectively, wherein the I pre-driver circuits generate I pre-driving signals according to the logic levels of the I block selection lines, respectively, the I pre-driving signals being transmitted to the I first local driver modules, respectively.

3. The memory device according to claim 2, wherein:
   when the input signal indicates that the i-th memory block is selected, an i-th block selection line selected from the I block selection lines is at the first logic level, and the i-th global power line transmits a first power voltage; and
   when the input signal indicates that the i-th memory block is unselected, the i-th block selection line is at the second logic level, and the i-th global power line transmits a second power voltage.

4. The memory device according to claim 3, wherein the first power voltage is higher than a read voltage, a write voltage and an erase voltage; and the second power voltage is lower than the read voltage, the write voltage and the erase voltage.

5. The memory device according to claim 3, wherein an i-th pre-driver circuit selected from the I pre-driver circuits comprises:
   a first pre-driver transistor electrically connected to the i-th block selection line;
   a second pre-driver transistor electrically connected to the first pre-driver transistor and the i-th global power line, wherein the second pre-driver transistor receives the first power voltage from a first power source; and
   a third pre-driver transistor electrically connected to the first pre-driver transistor and the i-th global power line, wherein the third pre-driver transistor receives the second power voltage from a second power source.

6. The memory device according to claim 5, wherein when the i-th block selection line is at the first logic level, the first pre-driver transistor and the second pre-driver transistor are switched on, and the third pre-driver transistor is switched off, the first power voltage being transmitted to the i-th global power line through the second pre-driver transistor and the first pre-driver transistor.

7. The memory device according to claim 5, wherein when the i-th block selection line is at the second logic level, the first pre-driver transistor and the second pre-driver transistor are switched off, and the third pre-driver transistor is switched on, the second power voltage being transmitted to the i-th global power line through the third pre-driver transistor.

8. The memory device according to claim 5, wherein each of the second pre-driver transistor and the third pre-driver transistor is an NMOS transistor, and the first pre-driver transistor is a PMOS transistor.

9. The memory device according to claim 1, wherein the transistor units comprises J*K memory cells arranged in J columns and K rows, J string selection transistors, and J ground selection transistors, the M gate control lines comprising:
   J string selection lines electrically connected to gates of the J string selection transistors, respectively;
   K word lines wherein a k-th word line selected from the K word lines is electrically connected to gates of J memory cells in a k-th column selected from the K columns; and
   P ground selection lines electrically connected to gates of the J ground selection transistors.

10. The memory device according to claim 9, wherein J, K, P are integers, M=(J+K+P), K is greater than J, and J is greater than or equivalent to P.

11. The memory device according to claim 1, wherein the m-th first local driver circuit is a local driver transistor with a gate electrically connected to the i-th global power line and a source electrically connected to the m-th gate control line.

12. The memory device according to claim 1, further comprising 2*I floating lines wherein each of the I memory blocks corresponds to two of the 2*I floating lines.

13. The memory device according to claim 12, wherein two floating lines corresponding to the i-th memory block are disposed at two sides of the i-th global power line, respectively.

14. The memory device according to claim 1, further comprising:
   I second local driver modules electrically connected to the I global power lines and the I memory blocks, respectively, wherein an i-th second local driver module selected from the I second local driver modules is electrically connected to the i-th global power line and the i-th memory block, the i-th second local driver module comprising:
      M second local driver circuits electrically connected to the i-th global power line, wherein an m-th second local driver circuit selected from the M second local driver circuits is electrically connected to the m-th gate control line.

15. The memory device according to claim 14, wherein the i-th first local driver module is disposed at one side of the i-th memory block, and the i-th second local driver module is disposed at the other side of the i-th memory block.

16. The memory device according to claim 14, wherein the i-th first local driver module and the i-th second local driver module transmit a voltage of the i-th global power line to the M gate control lines of the i-th memory block.

17. A control method of a memory device comprising I memory blocks and I global power lines corresponding to the I memory blocks, respectively, the control method comprising steps of:
   selecting an i-th memory block selected from the I memory blocks to perform memory operation, wherein the i-th memory block comprises M gate control lines and a plurality of transistor units arranged in M rows;
   generating I block selection signals, wherein an i-th block selection signal selected from the I block selection signals corresponds to the i-th memory block;
   outputting a first power voltage to an i-th global power line corresponding to the i-th memory block according to the i-th block selection signal;
   transmitting the first power voltage to the M gate control lines of the i-th memory block; and
   the M rows of the transistor units of the i-th memory block receiving the first power voltage through the M gate control lines of the i-th memory block, respectively.

18. The control method according to claim 17, further comprising steps of:
   outputting a second power voltage to (I−1) memory blocks other than the i-th memory block according to (I−1) block selection signals other than the i-th block selection signal; and
   transmitting the second power voltage to M gate control lines of each of the (I−1) memory blocks.

19. The control method according to claim 18, wherein the first power voltage is higher than a read voltage, a write voltage and an erase voltage; and the second power voltage is lower than the read voltage, the write voltage and the erase voltage.

20. The control method according to claim 17, wherein the memory device comprises 2I floating lines wherein each of the I memory blocks corresponds to two of the 2*I floating lines, and the two floating lines corresponding to the i-th memory block are disposed at two sides of the i-th global power line, respectively.

* * * * *